US007793013B1

(12) United States Patent
Esposito

(10) Patent No.: US 7,793,013 B1
(45) Date of Patent: Sep. 7, 2010

(54) HIGH-SPEED FIR FILTERS IN FPGAS

(75) Inventor: Benjamin Esposito, Oviedo, FL (US)

(73) Assignee: Altera Corporation, San Jose, CA (US)

( * ) Notice: Subject to any disclaimer, the term of this patent is extended or adjusted under 35 U.S.C. 154(b) by 527 days.

(21) Appl. No.: 11/323,387

(22) Filed: Dec. 29, 2005

(51) Int. Cl.
*G06F 13/00* (2006.01)

(52) U.S. Cl. .................. 710/33; 710/3; 710/71; 708/271; 708/300; 708/306; 708/309; 708/403

(58) Field of Classification Search .............. 710/71, 710/69, 70, 7, 33; 708/271, 300, 306, 309, 708/403, 446, 650, 681, 684, 685
See application file for complete search history.

(56) References Cited

U.S. PATENT DOCUMENTS 4,733,403 A * 3/1988 Simone ..................... 375/350
6,473,474 B1 * 10/2002 Wiegand ................... 375/350
2005/0021580 A1 * 1/2005 Swanson ................... 708/405
2006/0082476 A1 * 4/2006 Boyd et al. ................ 341/100

\* cited by examiner

*Primary Examiner*—Tariq Hafiz
*Assistant Examiner*—Jasjit S Vidwan
(74) *Attorney, Agent, or Firm*—Townsend and Townsend and Crew LLP

(57) ABSTRACT

Methods, circuits, and an apparatus for filtering high-speed serial data is disclosed. In one embodiment, a Programmable Logic Device (PLD) is configured with a filter circuit for filtering serial data at a first clock rate. The filter circuit converts an N number of serial data streams into an N number of M-bit words based on a deserialization factor. The M-bit words are converted to an M number of N-bit data words. The N-Bit data words are filtered at a second clock rate, reformatted, serialized, and outputted as individual serial data streams at the first clock rate. In one embodiment, the N-bit data words are digitally filtered by a Finite Impulse Response (FIR) filter operating at the second clock rate. The data output of the FIR filter is then serialized into an N number of serial data output streams operating at the first clock rate.

33 Claims, 9 Drawing Sheets

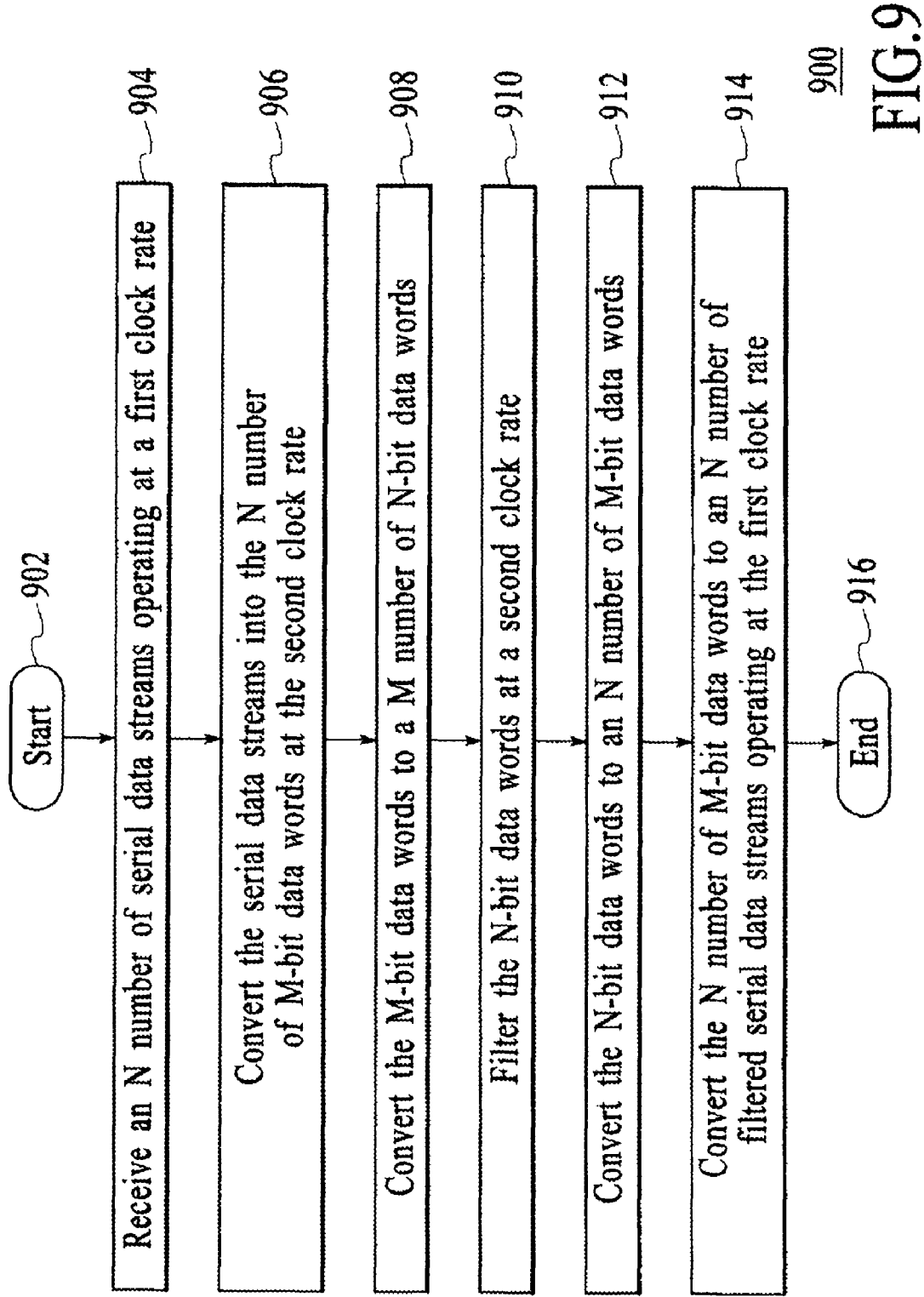

HIGH-SPEED FIR FILTERS IN FPGAS

BACKGROUND

The present invention relates generally to digital signal processing, and more specifically to filtering circuits used to filter digital data.

Generally, programmable logic devices (PLD) such as field programmable gate arrays (FPGA), include thousands of programmable logic cells that use combinations of logic gates and/or look-up tables (LUTs) to perform a logic operation. Programmable devices also include a number of functional blocks having specialized logic devices adapted to specific logic operations, such as serializers, deserializers, filters, adders, multiply and accumulate circuits, and phase-locked loops (PLL). The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

Due to their programmability and flexible circuit functionality, PLDs are increasingly being used for digital signal processing (DSP) functions. DSP functions are employed to process digital signals used in personal entertainment system, wireless communication, remote medical diagnosis, etc. For example, FPGAs are often configured and employed to process digital signals used in modern cellular phone systems, studio editing equipment, high definition televisions, etc.

Digital data may be derived from many sources and transmitted in a serial or parallel fashion depending on the transmission methodology. For example, digital data may be derived from analog data such as a voice or music and transmitted as a serial or parallel digital signal to a digital receiver. Illustratively, an analog-to-digital converter (A/D) converter may be used in a cellular phone to convert a voice of one caller to a parallel digital signal. The parallel digital signal is processed by a DSP processing device, such as an FPGA, embedded in the caller's cellular phone to produce a digital signal suitable for transmission over the cellular network. The digital signal is transmitted by the caller's cellular phone to another cellular phone in the cellular network using cellular network transmission data transmission protocols and methods. A DSP device in the other cellular phone receives the digital signal, processes the digital signal, and outputs a digital signal to a digital-to-analog (D/A) converter to convert the digital data back to analog speech.

Unfortunately, conventional DSP device data processing throughput is constrained by its maximum operating clock rate (e.g., maximum operating clock frequency). For example, conventional digital systems employing DSP filters, such as conventional DSP filters, are limited to filtering digital signals at a processing speed which cannot extend beyond the operating clock rate of the DSP filter, thereby limiting the overall throughput of the digital system. While increasing the processing speed of the DSP filter is a one solution typically sought by the DSP device industry, increasing the operating clock rate of the DSP device is often constrained by operational frequency limitations of internal devices and/or device development costs.

Accordingly, it is desirable to have circuits, methods, and an apparatus for implementing an improved DSP filter that allows for increased DSP processing throughput without requiring the increase of the DSP operating clock rate or device development cost.

SUMMARY

In one embodiment, a Programmable Logic Device (PLD) is configured with a filter circuit used to receive high-speed serial data at a first clock rate, process the serial data at a second clock rate, and output the processed serial data at the first clock rate. In one embodiment, the filter circuit converts (e.g., deserializes) the high-speed serial data at the first clock rate into an N number of M-bit words. The M-bit words are converted to an M number of N-bit words with respect to a deserialization factor DF, where DF may equal M. The N-bit words are then filtered at the second clock rate, serialized, and outputted as an N number of output serial data streams operating at the first clock rate. For example, where N equals eight lines of high-speed serial data operating at the first clock rate, and for a deserialization factor equal to four, the filter circuit converts the eight lines of high-speed data into four, eight-bit words. Each of the four eight-bit words are filtered with a digital filter, such as a Finite Impulse Response (FIR) filter, operating at the second clock rate. Once filtered, the four eight-bit words are serialized to form an N number of high-speed serial data streams operating at the first clock rate.

In another embodiment, PLD registers are configured to form a serial input data reformatter and a multiphase FIR filter. The serial input data reformatter converts high-speed serial data streams operating a first clock rate into a M number of N-bit input data streams operating at a second clock rate. An array of shift registers acting as the tap delay line are arranged into a set of M parallel FIR filters operating at the second clock rate. Since each of these M parallel FIR filters use identical coefficients, an analysis of the relationship between the data moving through the tap delay line and the respective coefficient values may be performed. From the analysis, an architecture may be realized that uses fewer number of registers than is normally found in conventional FIR filters. Each of the parallel FIR filters filter a respective N-bit input data stream by multiplying each bit of a respective N-bit input data stream by a respective filter coefficient and summing the products. The resultant output data word is reformatted to form an N number of M-bit output data words. The M-bit output data words are then further serialized to form an N number of streams of high-speed output serial data operating at the first clock rate.

A better understanding of the nature and advantages of the present invention may be gained with reference to the following detailed description and the accompanying drawings.

BRIEF DESCRIPTION OF THE DRAWINGS

FIG. 9 is a flow diagram of a method of filtering digital data, in accordance with embodiments of the invention.

DESCRIPTION OF EXEMPLARY EMBODIMENTS

Figure 1:
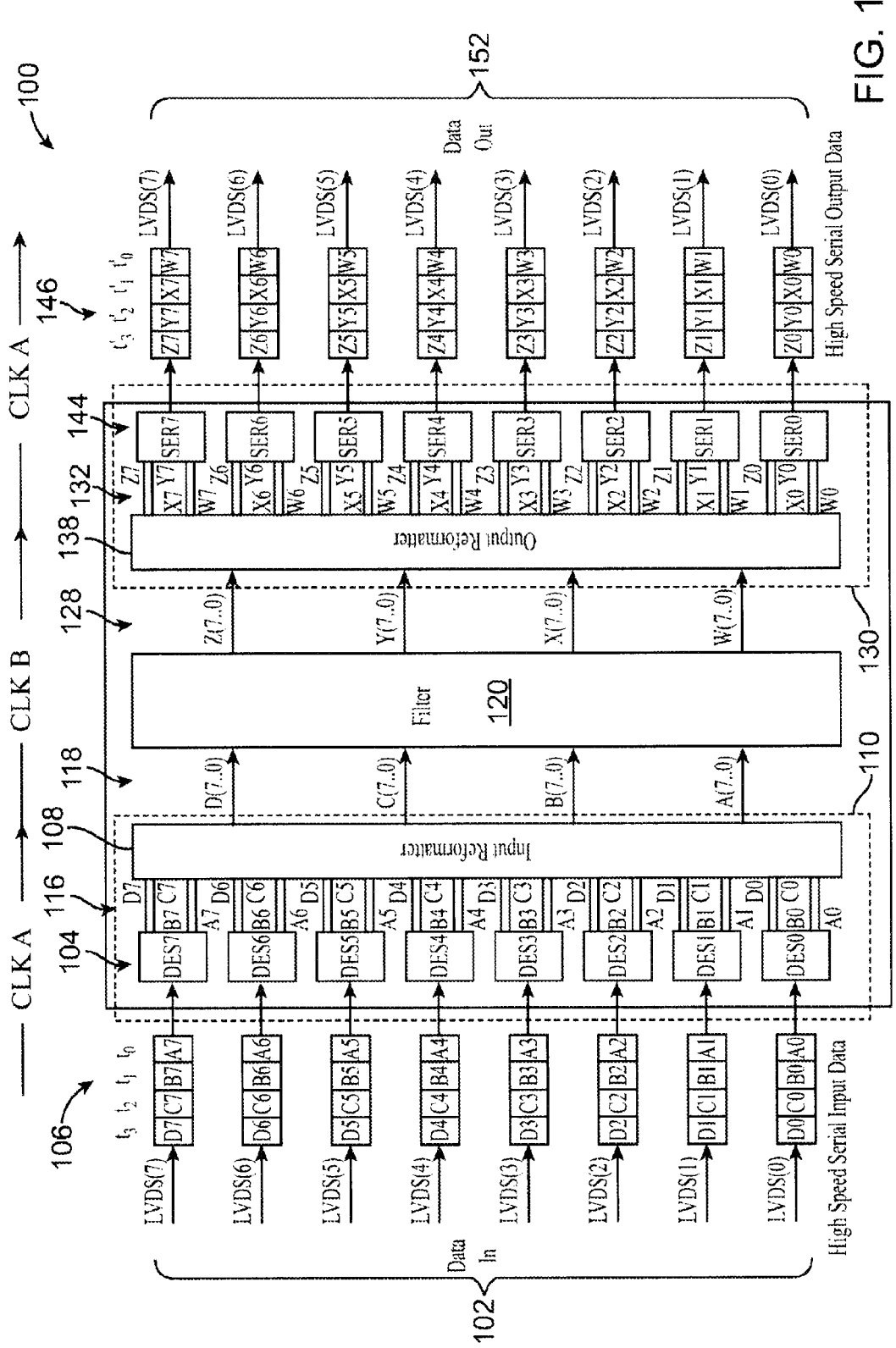
FIG. 1 illustrates a simplified schematic view of one embodiment of signal processing circuit in accordance with embodiments of the invention.

FIG. 1 illustrates a simplified schematic view of one embodiment of signal processing circuit 100 which may be a circuit implemented in a PLD device such as a FPGA, described herein. Signal processing circuit 100 is capable of converting parallel digital data of N bits at a clock rate A, into a plurality of input data streams (e.g., data words of N-bits), filtering the plurality of input data streams at a clock rate B. The clock rate B may be equal to or less than the clock rate A. The signal processing circuit 100 converts the filtered input data streams to streams of output serial data operating at clock rate A.

Signal processing circuit 100 includes a digital data receiving circuit 110, a filter circuit 120, and a digital data output section 130. Digital data receiving circuit 110 is capable of receiving and processing streams of input serial data 106 received from, for example, an analog-to-digital (A/D) converter (not shown). In one embodiment, the streams of input serial data 106 are received from an A/D converter capable of generating a parallel data output from an analog data input. In this illustration, the parallel data output is eight-bits wide resulting in eight streams of input serial data 106, where each output of the A/D converter provides one of the streams of input serial data 106 (e.g., A[7:0]). As illustrated, streams of input serial data 106 are representative of received parallel data words (e.g., LVDS[7:0]) at a clock rate A. Clock rate A may represented in the time domain as the time at which each parallel data words, e.g., parallel data A[7:0], B[7:0], C[7:0], D[7:0], and so forth, are received (e.g., clocked) by the digital data receiving section 110. For example, parallel data A[7:0] is received at time $t_0$, parallel data B[7:0] is received at time $t_2$, and so forth. Clock rate A may be any clock rate used to advantage, for example, in one embodiment, for an A/D converter transmitting parallel data at 1 GHZ to the signal processing circuit 100, clock rate A is 1 GHZ.

In one embodiment, the digital data receiving circuit 110 includes a plurality of deserializer circuits 104 coupled to an input reformatter circuit 108. The deserializer circuits 104 are capable of converting the streams of input serial data 106 to parallel data words with respect to a deserialization factor DF. Illustratively, deserializer circuits 104 are shown as deserializer circuits DES0-7. While only eight deserializer circuits DES0-7 are shown, those skilled in the art would appreciate that any number of deserializer circuits 104 may be used to accommodate different parallel data bit widths. For example, for a sixteen bit parallel word, sixteen deserializer circuits 104 may be used. While each of the streams of input serial data 106 are shown as low voltage differential serial data (LVDS), one skilled in the art would appreciate that the streams of input serial data 106 may be of any type of digital data transmission format that may be used to advantage. For example, the streams of input serial data 106 may be data signals transmitted at voltage levels such as TTL, CMOS, and the like.

In one embodiment, for a given deserialization factor DF, deserializer circuits DES0-7 are capable of outputting M-bit words 116 for a respective streams of input serial data 106 to the input reformatter 110. Illustratively, for a deserialization factor of DF=4, the deserializer circuits DES0-7 are capable of generating a four-bit word from the input serial data. For example, for serial data stream LVDS7, deserializer circuit DES7 generates parallel data outputs A7, B7, C7, and D7 at clock rate B. The parallel data outputs A7, B7, C7, and D7 for a four-bit word where one significant bit of data associates the words bit position. In this case, the number "7" is indicative of a bit position of seven, whereas for a four-bit word having data outputs of A0, B0, C0, and D0, the "0" is indicative of a bit position of zero.

The input reformatter circuit 108 converts the M-bit words 116 (e.g., A7-D7) into a M number of N-bit data streams 118. As illustrated in FIG. 1, for a deserialization factor DF of four, and an N of eight, the number of eight-bit data streams 118 is four. In one embodiment, the input reformatter circuit 106 processes (e.g., shuffles) the M-bit words 116 to generate the N-bit data streams 118 with respect to bit location (e.g., A[7:0], B[7:0], C[7:0], and D[7:0]). The N-bit data streams 118 are coupled to the filter circuit 120.

In one embodiment, the filter circuit 120 includes a bank of filters operating at clock rate B. The filters can be of any type of programmable or fixed filter, and may be formed from combinational logic of a PLD, and/or formed from discrete components. For example, the bank of filters may include programmable digital filters such as a finite-impulse-response (FIR) filter, infinite-impulse-response (IIR) filters, and the like, formed from combinational logic of a PLD operating at clock rate B. Advantageously, as filtering may be performed by filters that operate at a much lower processing clock rate (e.g., clock rate B) than the transmission clock rate (e.g., clock rate A) of the parallel data received by the signal processing circuit 100, components capable of operating at the lower frequency operation may be used. For example, the filter circuit 120 may include a bank of FIR filters capable of programmably filtering the input N-bit data streams 118 at the clock rate B.

The total number of filters may be determined by the deserialization factor DF which may be determined by dividing clock rate A by clock rate B. For example, consider a clock rate A of 1 GHZ and a clock rate B of 250 MHZ, the total number of filters may be 1 GHZ/250 MHZ, or four. In another embodiment, for a clock rate A of 2 GHZ and a clock rate B of 250 MHZ, the total number of filters would be 2 GHZ/250 MHZ, or eight.

In response to the input N-bit data streams 118, the filter circuit 120 generates an M number of N-bit output data streams 128. The N-bit output data streams 128 are a filtered version of the input N-bit data streams 118. The N-bit output data streams 128 are coupled to the digital data output section 130 for processing thereof.

In one embodiment, the digital data output section 130 includes an output data reformatter circuit 138 and a plurality of serializer circuits 144. The output data reformatter circuit 138 converts (e.g., reshuffles) the N-bit output data streams 128 into an N number of M-bit output words 132. The M-bit output words 132 are coupled to the serializer circuits 144. The serializer circuits 144 convert (e.g., serialize) the M-bit output words 132 into an N number of streams of output serial data 146. Similar to the streams of input serial data 106, the N number of streams of output serial data 146 may represent an N-bit output word 152, which in this illustration is a filtered version of the N-bit input word 102.

Figure 2:
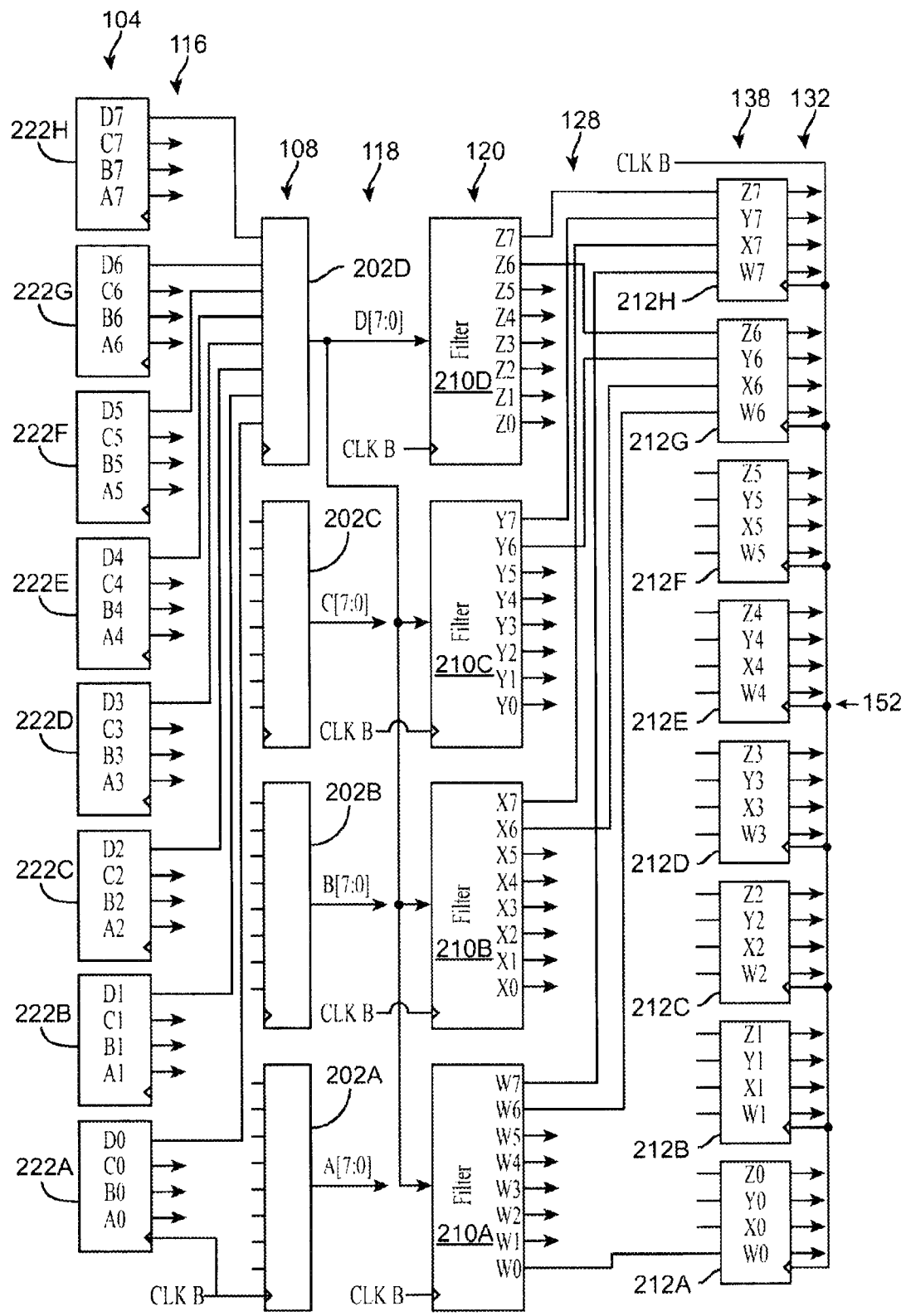
FIG. 2 illustrates a simplified schematic view of one embodiment of an input reformatter circuit, filter circuit, and an output data reformatter circuit for use with the signal processing circuit of FIG. 1, in accordance with embodiments of the invention.

FIG. 2 illustrates a simplified schematic view of one embodiment of the deserializers 104, an input reformatter circuit 108, filter circuit 120, and an output data reformatter circuit 138 for use with the signal processing circuit 100 of FIG. 1. In one embodiment, the input reformatter circuit 108 includes a plurality of registers 202A-D. Registers 202A-D are configured to receive M-bit words 116 from deserializer circuits 222A-H. The M-bit words 116 are mapped according to weighted bit position at each register 202A-D. For example, registers 202D includes inputs for receiving M-bit words D[7:0] with bit positions 0-7, register 202C receives M-bit words C[7:0] with weighted bit positions 0-7, and so forth.

When operated by clock B, registers 202A-D output respective N-bit input data streams 118. For example, register 202A outputs respective input N-bit data stream A[7:0], register 202B outputs respective input N-bit data stream B[7:0], register 202C outputs respective input N-bit data stream C[7:0], and register 202D outputs respective input N-bit data stream D[7:0] at clock rate B. While only four registers 202A-D are shown, those skilled in the art will appreciate that a variety of registers and/or other logic circuits may be configured to derive the N-bit input data streams 118 from the M-bit words 116.

In one embodiment, the filter circuit 120 includes a signal filter, such as a FIR filter, for filtering N-bit input data streams 118. Illustratively, filter circuit 120 includes signal filters 210A-D. For example, signal filter 210A filters the N-bit input data stream 118 received from registers 202A-D, in parallel, signal filter 210B filters the N-bit input data stream 118 received from registers 202A-D, in parallel, signal filter 210C filters the N-bit input data stream 118 received from registers 202A-D, and in parallel, signal filter 210D filters the N-bit input data stream 118 received from registers 202A-D. For clarity, while each N-bit input data stream 118 from the registers 202A-D is coupled to each signal filter 202A-D, only one N-bit input data stream 118 is illustrated coupled between registers 202A-D and signal filter 210D.

In response to receiving a respective N-bit input data stream 118 from registers 202A-D, the filter circuit 120 generates respective N-bit output data streams 128. For example, filter 210A generates an 8-bit output data stream W[7:0] in response to 8-bit input data streams A[7:0]-D[7:0], filter 210B generates 8-bit output data stream X[7:0] in response to 8-bit input data streams A[7:0]-D[7:0], filter 210C generates 8-bit output data stream Y[7:0] in response to 8-bit input data streams A[7:0]-D[7:0], and filter 210D generates 8-bit output data stream Z[7:0] in response to 8-bit input data streams A[7:0]-D[7:0].

The output data reformatter circuit 138 includes a plurality of output registers 212A-H. In one embodiment, the number of output registers 212A-H is equal to the bit resolution of the output data word 152, which may be equal to the bit resolution of the input data word 102. For example, as illustrated in FIG. 2, for an eight-bit output word 152 there would be eight output registers 212A-H.

The output registers 212A-H are configured to generate an N number of M-bit output words 132 from the M number of N-bit output data streams 128 for processing by respective serializer circuits 144. In one embodiment, the N-bit output data streams 128 are mapped according to their weighted bit-position to a respective output register 212A-H. For example, the seventh bit of N-bit output data stream Z[7:0], the seventh bit of N-bit output data stream Y[7:0], the seventh bit of N-bit output data stream X[7:0], and the seventh bit of output N-bit data stream W[7:0] are connected to respective inputs of the output register 212H. The sixth bit of N-bit output data stream Z[7:0], the sixth bit of N-bit output data stream Y[7:0], the sixth bit of N-bit output data stream X[7:0], and the sixth bit of output N-bit data stream W[7:0] are connected to respective inputs of the output register 212G, and so forth. The resultant output M-bit words 132 from each of the output registers 212A-H are clocked through the output registers 212A-H to respective serializer circuits 144 operating at clock rate A. While only eight registers 212A-H are shown, those skilled in the art will appreciate that a variety of registers and/or other logic circuits may be configured to derive the N number of M-bit output words 132.

Figure 3:
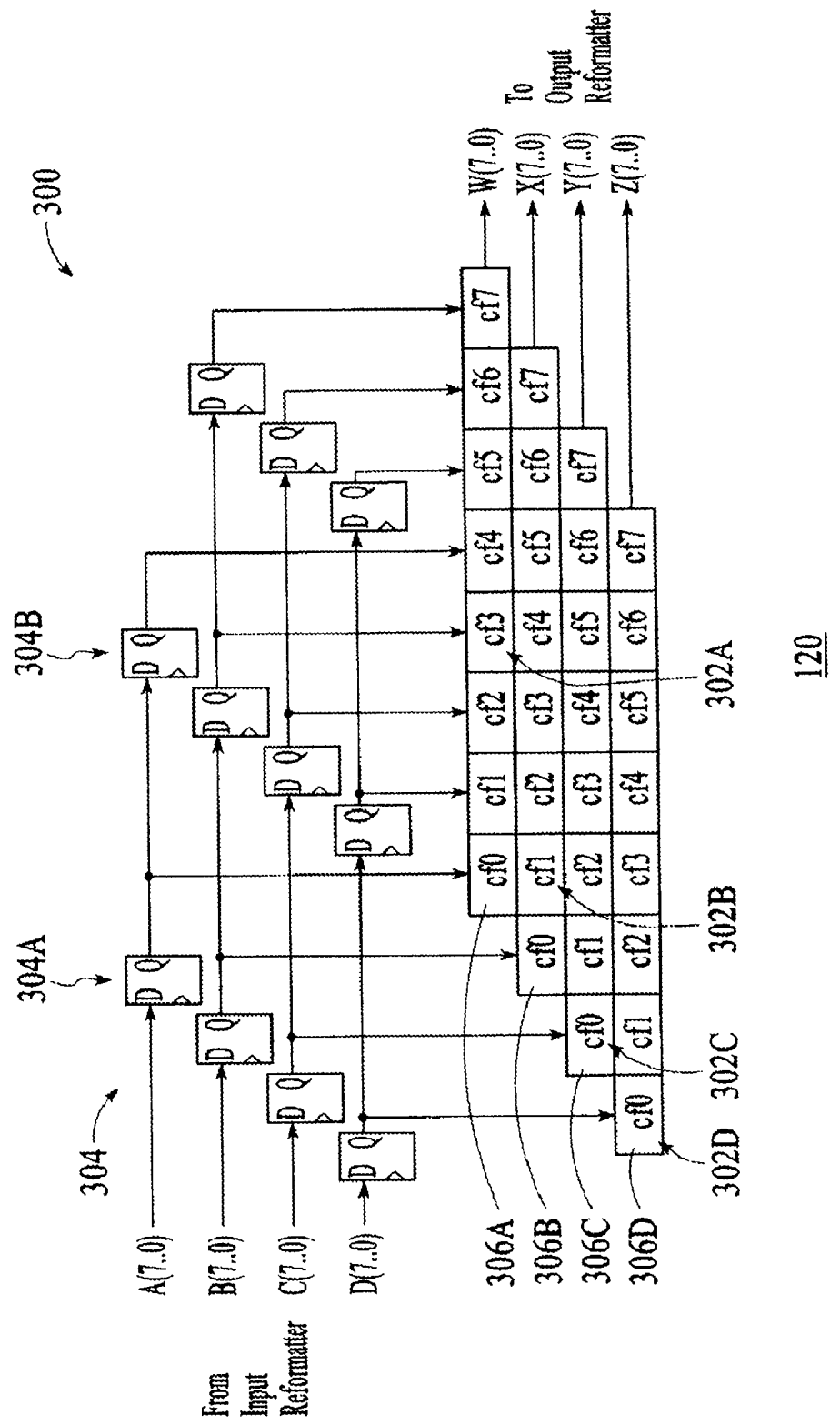
FIG. 3 illustrates a simplified schematic view of one embodiment of an eight-tap FIR filter, in accordance with embodiments of the invention.

FIG. 3 illustrates a simplified schematic view of one embodiment of filter circuit 120 configured as a FIR filter 300. In one embodiment, the FIR filter 300 is configured as a multiphase filter bank with an M number of K-tap coefficient FIR filters 302A-D formed from respective registers 304 and a respective series of coefficient blocks CF0-K, where K is one or more taps. For example, FIR filter 300 includes four separate FIR filters 302A-D that are formed from four banks 306A-D of eight filter-coefficient taps CF0-7 and associated registers 304. Each input N-bit data stream 118 is coupled to coefficient taps CF0-7 of a respective FIR filter 302A-D via its respective register 304. For example, N-bit input data stream A[7:0] via register 304A is coupled to coefficient block CF0 of FIR filter 302A, coefficient block CF1 of FIR filter 302B, coefficient block CF2 of FIR filter 302C, and coefficient block CF3 of FIR filter 302D. Illustratively, N-bit input data stream A[7:0] is coupled via a second register 304B to coefficient block CF4 of FIR filter 302A, coefficient block CF5 of FIR filter 302B, coefficient block CF6 of FIR filter 302C, and coefficient block CF7 of FIR filter 302D.

Figure 4:
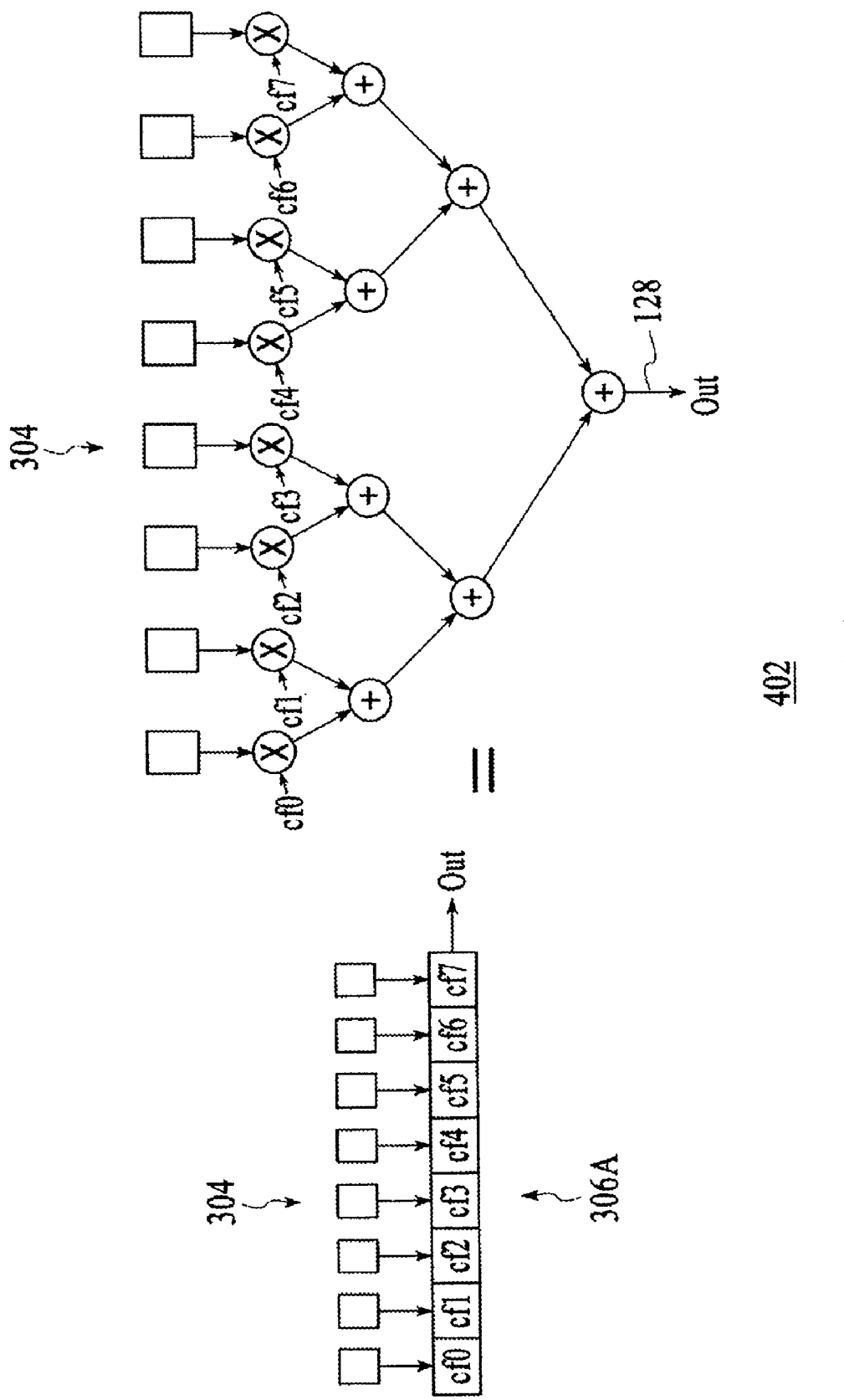
FIG. 4 illustrates an eight-tap FIR filter configured to filter an eight-bit input data stream using eight filter coefficients, in accordance with embodiments of the invention.

FIG. 4 illustrates a simplified block diagram view of one FIR filter 302A and the multiplier and adder tree 402 associated with processing the input N-bit data stream 118. In one embodiment, FIR filter 302A (or any of the FIR filters 302) may be represented by the following formula:

$$\text{out} = \sum_{i=0}^{L-1} x(n-i)h(i) \quad \text{(Equation 1)}$$

Where L is the number of taps, x(n) represents the sequence of input samples, h(i) represent each filter coefficient (e.g., CF0-7), and i represents the number of filter coefficients. Each of the outputs, e.g., are multiplied with their respective filter coefficients (e.g., CF0-7) and added together to produce the output.

According to equation one, with L=8, a FIR filter with eight taps is capable of filtering an eight-bit input data stream 118 by multiplying each of the eight-bit input data streams 118 with their respective filter coefficients. As illustrated in the multiplier and adder tree 402, the resultant products (e.g., dot-products) are summed to produce eight-bit output data streams 128. For example, FIG. 4 shows eight-bit data from registers 304 input to the eight-tap coefficient block 306A. According to equation two, FIR filter 302A multiples the eight bit data from the registers 304 with the filter coefficients CF0-7 and then sums the products to generate the eight-bit output data stream W[7:0].

In one embodiment, by analyzing the relationship between the N-bit input data streams A[7:0]-D[7:0] and coefficient blocks CF0-7 for each of the FIR filters (e.g., filters 302A-D), in parallel, the number of registers required to generate the FIR filter may be reduced. Generally, a FIR filter provides an averaging function of an input data stream by multiplying a given input data set by a set of coefficients at a give clock cycle. The data is averaged over multiple clocks with each successive value stored in a holding register. These groups of holding registers are known as a tap delay line. At each clock cycle, the data is shifted through the tap delay line lining up with the next coefficient. For each new data input word the oldest word is dropped from the tap delay line. Accordingly, for a conventional eight-tap filter it typically requires 64 registers (8 taps*8 bit data). Therefore, four conventional eight-tap filters would normally require 256 registers for the tap delay line (4 filters*8 taps*8 bit data). For example, referring to the four, eight-tap FIR filters 300 illustrated in FIG. 3, as the data streams are filtered in parallel A[7:0]-D[7:0], by analyzing the data moving through the tap delay line relative to the coefficient position and at the same time knowing time relationship of the input data streams A[7:0]-D[7:0], the four, eight-tap filters (e.g., filters 302A-D) of the present invention require substantially less registers than conventional FIR filters, as calculated below with regard to equation two.

Equation two represents the number of registers required to form an eight-tap FIR filter of the present invention.

Registers for a *FIR* filter of N taps = parallel data width * ((Number of tap coefficients + (clock rate A/clock rate B − 1))   (Equations 2)

For example, using equation one, for a FIR filter of eight coefficient taps at a clock rate A of 1 GHZ and a clock rate B of 250 MHZ:

88 registers=8*(8+(1 GHZ/250 MHZ−1))

Advantageously, this is substantially lower than the 256 registers normally needed to support the conventional multiphase 8 tap FIR filters.

Figure 5:
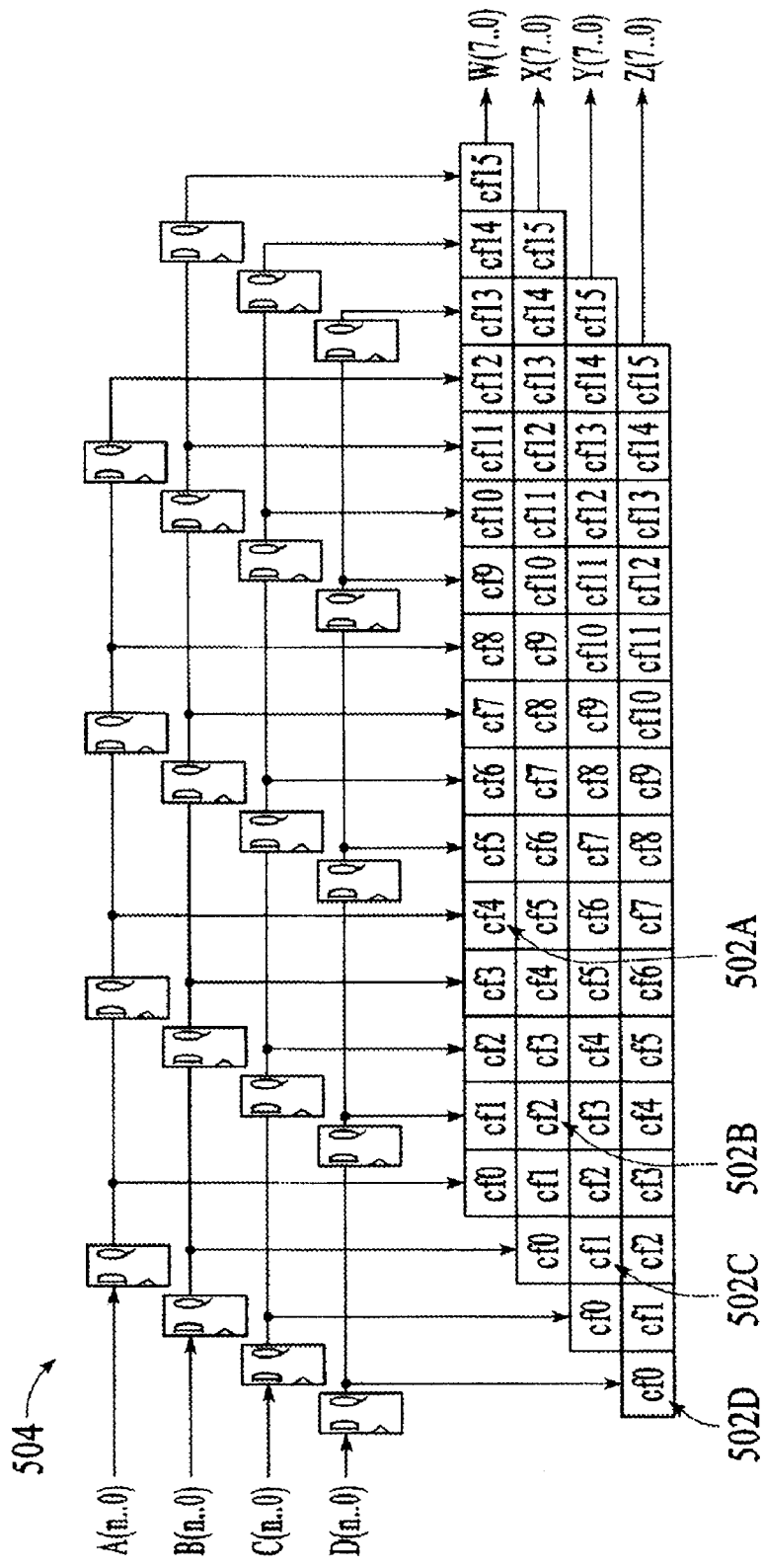
FIG. 5 illustrates a simplified schematic view of one embodiment of a sixteen-tap FIR filter, in accordance with embodiments of the invention.

While FIG. 4 illustrates an eight-tap FIR filter, any number of different FIR filters may be formed to accommodate a variety of input data streams, clock rates, output data streams, etc. For example, FIG. 5 illustrates a simplified schematic view of one embodiment of a sixteen-tap FIR filter 120B. Using equation one, for a FIR filter of sixteen filter coefficient taps with at a clock rate A of 1 GHZ and a clock rate B of 250 MHZ:

152 registers=8*(16+(1 GHZ/250 MHZ−1))

In this illustration, only one hundred and fifty two registers are needed to form FIR filter 120B instead of 512. Using the serializer rate M equal to 1 GHZ/250 MHZ, the number of FIR filters is four. For example, in this illustration, FIR filter 120B includes FIR filters 502A-D coupled to N-bit input data 118 via registers 504.

Figure 6:
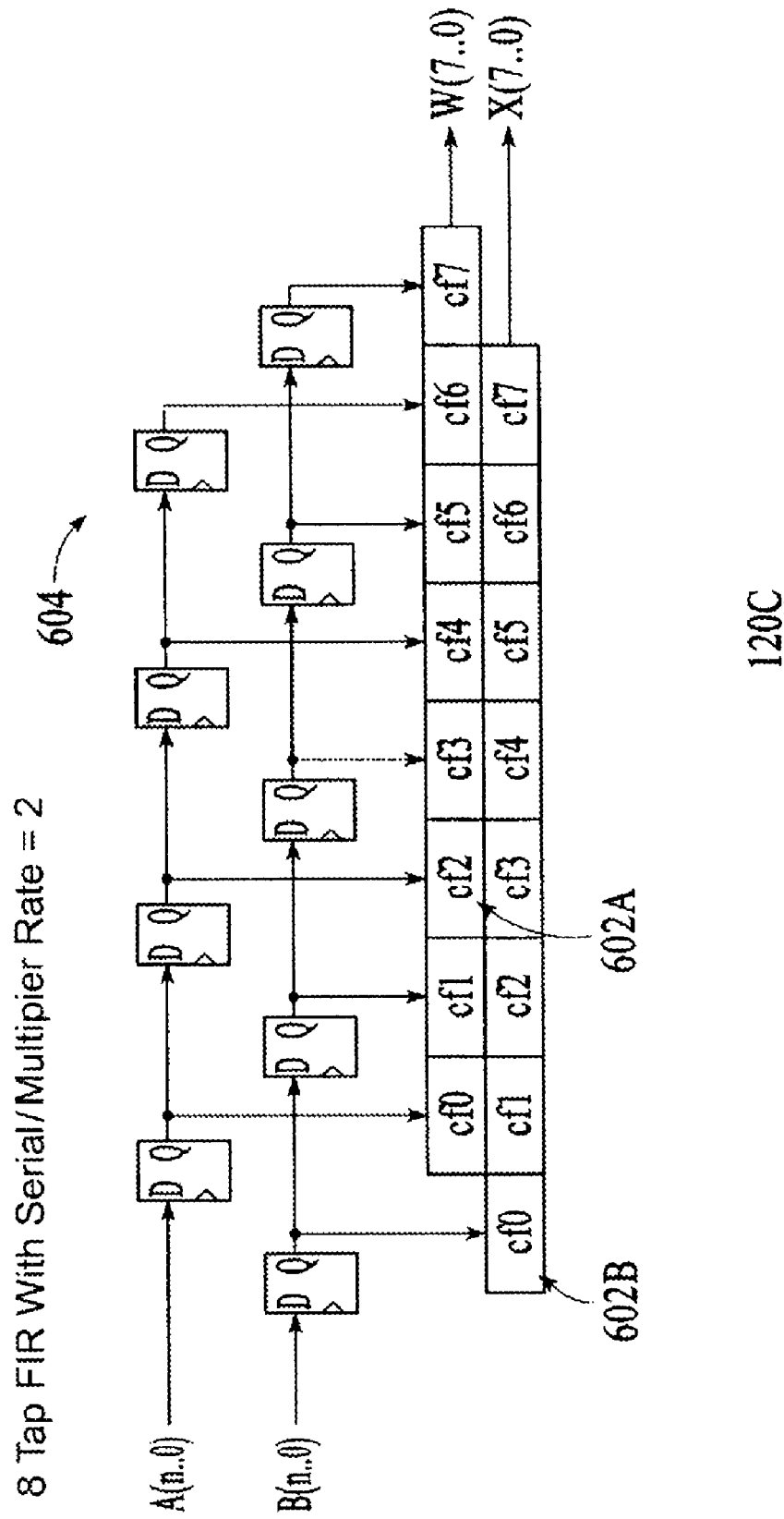
FIG. 6 illustrates a simplified schematic view of one embodiment of a eight-tap FIR filter of FIG. 1 with a multiplier factor of two, in accordance with embodiments of the invention.

Similarly, FIG. 6 illustrates a simplified schematic view of one embodiment of an eight-tap FIR filter 120C. Using equation one, for a FIR filter of eight filter coefficient taps at a clock rate A of 800 MHZ and a clock rate B of 400 MHZ:

72 registers=8*(8+(800 MHZ/400 MHZ−1))

In this illustration, only sixty-four registers are needed to form FIR filter 120C. Using the serializer rate M equal to 800 GHZ/4000 MHZ, the number of FIR filters is two. For example, in this illustration, FIR filter 120C includes FIR filters 602A-B coupled to N-bit input data 118 via registers 604.

Figure 7:
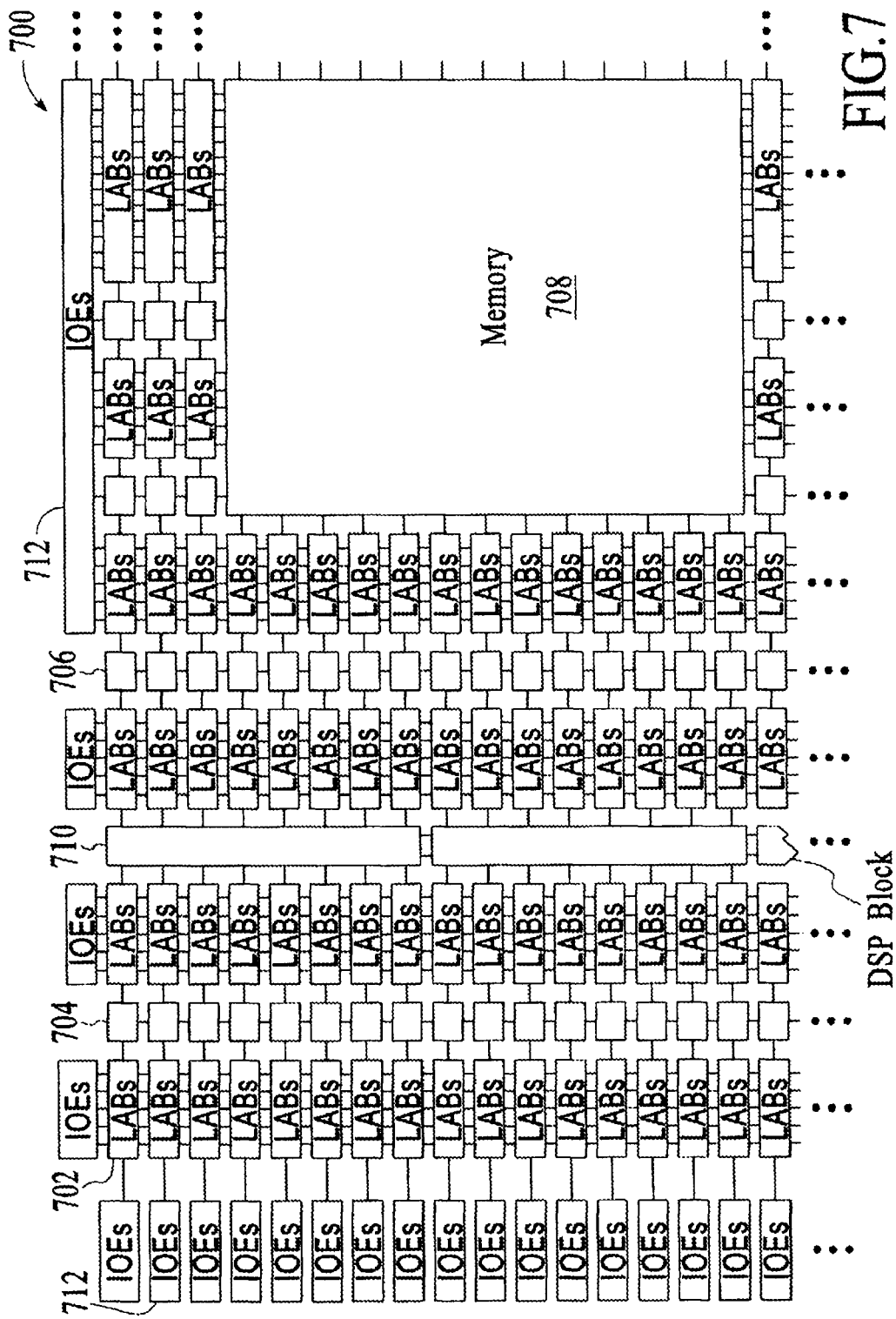
FIG. 7 is a simplified block diagram of a programmable logic device that can embody the techniques of the present invention.

FIG. 7 is a simplified partial block diagram of one example of PLD 700 that can include aspects of the present invention. It should be understood that the present invention can be applied to numerous types of integrated circuits including programmable logic integrated circuits, field programmable gate arrays, mask FPGAs, and application specific integrated circuits (ASICs). PLD 700 is an example of a programmable logic integrated circuit in which techniques of the present invention can be implemented. PLD 700 includes a two-dimensional array of programmable logic array blocks (or LABs) 702 that are interconnected by a network of column and row interconnects of varying length and speed. LABs 702 include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 700 also includes a distributed memory structure including RAM blocks of varying sizes provided throughout the array. The RAM blocks include, for example, 512 bit blocks 704, 4K blocks 706, and a block 708 providing 512K bits of RAM. These memory blocks can also include shift registers and FIFO buffers.

PLD 700 further includes digital signal processing (DSP) blocks 710 that can implement, for example, FIR filters, multipliers with add or subtract features, and the like. I/O elements (IOEs) 712 located, in this example, around the periphery of the device support numerous single-ended and differential I/O standards. It is to be understood that PLD 700 is described herein for illustrative purposes only and that the present invention can be implemented in many different types of PLDs, FPGAs, and the like.

Figure 8:
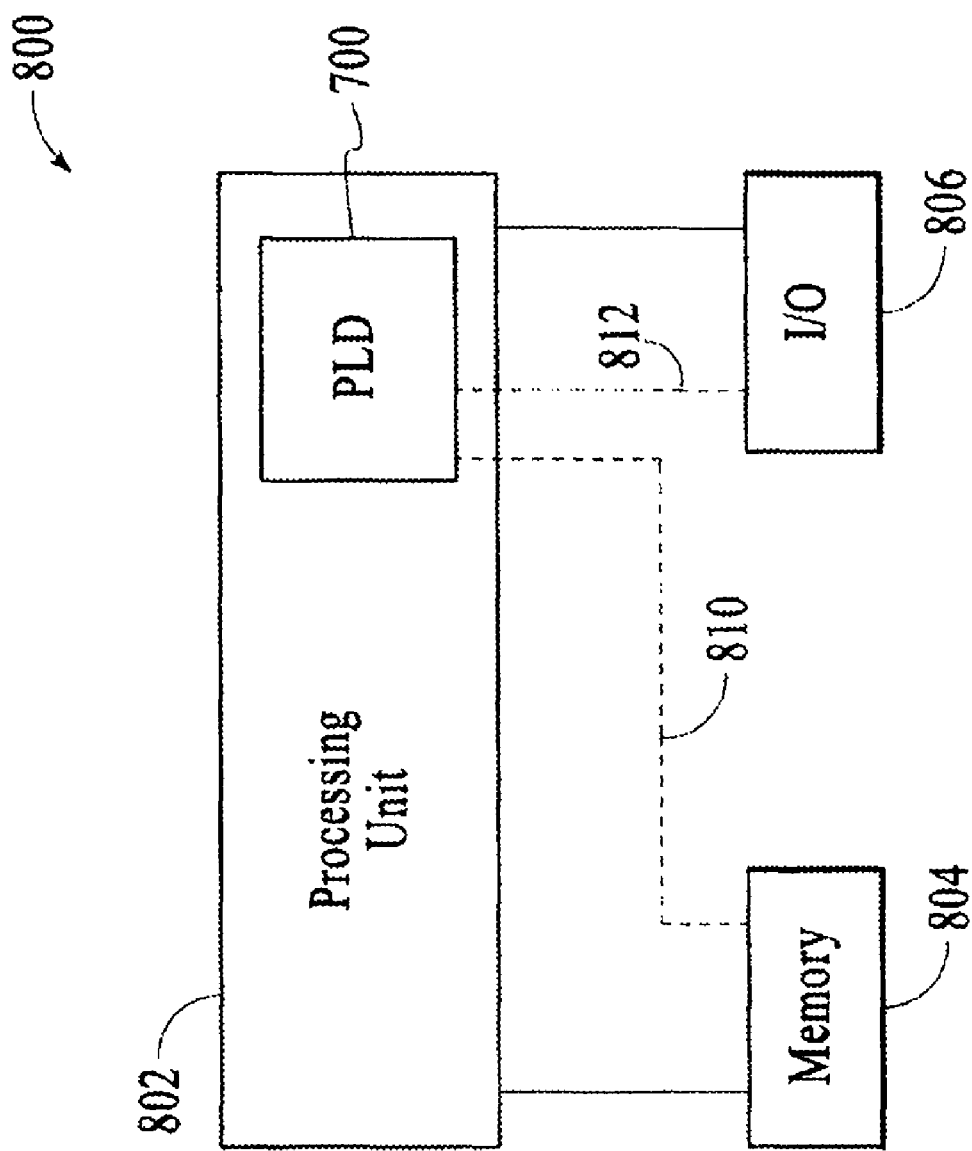
FIG. 8 is a simplified block diagram of an electronic system that can implement embodiments of the present invention.

While PLDs 700 of the type shown in FIG. 7 may provide many of the resources required to implement system level solutions, the present invention can also benefit systems wherein a PLD is one of several components. FIG. 8 shows a block diagram of an exemplary digital system 800, within which the present invention can be embodied. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804 and an I/O unit 806 interconnected together by one or more buses. According to this exemplary embodiment, a programmable logic device (PLD) 700 is embedded in processing unit 802. PLD 700 can serve many different purposes within the system in FIG. 8. PLD 700 can, for example, be a logical building block of processing unit 802, supporting its internal and external operations. PLD 700 is programmed to implement the logical functions necessary to carry on its particular role in system operation. PLD 700 can be specially coupled to memory 804 through connection 810 and to I/O unit 806 through connection 812.

Processing unit 802 can direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 700 can control the logical operations of the system. In an embodiment, PLD 700 acts as a reconfigurable processor, which can be reprogrammed as needed to handle a particular computing task. Alternately, PLD 700 can itself include an embedded microprocessor. Memory unit 804 can be RAM, SRAM, read only memory ROM, fixed or flexible disk media, PC Card flash disk memory, tape, or any other storage means, or any combination of these storage means.

FIG. 9 is a flow diagram of a method 900 of filtering digital data. Method 900 starts at step 902, when for example, signal processing circuit 100 is activated. At step 904, serial data is received by signal processing circuit 100 at a clock rate A. The serial data may be received individually, or derived from an N number of streams of serial data operating in parallel. For example, the serial data may be derived from an eight-bit parallel output of an A/D converter, where the parallel data output forms the N number of streams of serial data, clocked at clock rate A. At step 906, based on weighted bit position, the N number of streams of serial data are converted at clock rate A into an N number of M-bit words operating at clock rate B. For example, eight streams of serial data operating at clock rate A may be converted into eight, four-bit words operating at a clock rate B. At step 908, the N number of M-bit words are converted to an M number of N-bit words operating at clock rate B. Illustratively, for a clock rate A four times clock rate B (which provides a deserializing factor of four), the eight, four-bit words may be converted to four, eight-bit words.

At step 910, each of the M number of N bit words is then filtered at clock rate B. A filtered version of the M number of N-bit words is converted at step 912 to an N number of M-bit output words. For example, the four, eight-bit data streams may be filtered at clock rate B and then converted to eight, four-bit output words. The N number of M-bit output words are converted at step 914 to an N number of streams of output serial data operating at clock rate A. At step 916, the method 900 ends.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit including a digital signal filter comprising:
    a digital data receiving section capable of converting serial data operating at a first clock rate to parallel data;
    a Finite Impulse Response filter circuit comprising a number of digital filters operating at a second clock rate, wherein the Finite Impulse Response filter circuit generates a plurality of digital data streams from the parallel data, and wherein the Finite Impulse Response filter circuit filters the plurality of digital data streams at the second clock rate; and
    a digital data output section capable of converting the plurality of filtered digital data streams operating at the second clock rate into a filtered version of the serial data operating at the first clock rate,
    wherein the number of the digital filters is equal to the first clock rate divided by the second clock rate.

2. The integrated circuit of claim 1, wherein the digital data receiving section comprises a deserializer circuit capable of converting the serial data to the parallel data.

3. The integrated circuit of claim 2, wherein the digital data receiving section comprises an input data formatter circuit capable of generating the digital data streams from the parallel data.

4. The integrated circuit of claim 1, wherein the Finite Impulse Response filter circuit comprises a finite impulse response filter or an infinite response filter.

5. The integrated circuit of claim 4, wherein the finite impulse response filter comprises a number of registers determined by the equation:

$$\text{number of registers} = \text{parallel data width} * (\text{number of tap coefficients} + (\text{clock rate } A/\text{clock rate } B - 1)).$$

6. The integrated circuit of claim 1, wherein the digital data output section comprises an output data formatter capable of generating output parallel data at the first clock rate from the digital data streams operating at the second clock rate.

7. The integrated circuit of claim 6, wherein the digital data output section comprises a serializer circuit capable of generating output serial data operating at the first clock rate from the output parallel data.

8. A method of filtering serial data operating at a first clock rate using a Finite Impulse Response filter circuit operating at a second clock rate, comprising:
    receiving, at the Finite Impulse Response filter circuit, streams of input serial data operating at the first clock rate;
    deserializing the input serial data into parallel data;
    generating a plurality of input data streams from the parallel data;
    filtering each of the plurality of data streams at a second clock rate with the Finite Impulse Response filter circuit; and
    after filtering, serializing the plurality of data streams into individual streams of wherein the number of filters is the first clock rate divided by a deserialization factor output serial data,
    wherein the number of filters is the first clock rate divided by a deserialization factor.

9. The method of claim 8, wherein the deserializing is performed by a deserializer circuit.

10. The method of claim 8, wherein generating the plurality of input data streams comprises converting an N number of M-bit words formed by the parallel data into an M number of N-bit words operating at the second clock rate.

11. The method of claim 8, wherein filtering each of the data streams comprises filtering each of the input data streams with a digital filter operating at the second clock rate.

12. The method of claim 11, wherein the digital filter is a finite impulse response filter.

13. The method of claim 8, wherein deserializing comprises converting the input data streams into an N number of output data words, wherein N represents at least one individual stream of the serial data.

14. The method of claim 8, wherein serializing comprises serializing the N number of output data words into an N number of individual streams of output serial data operating at the first clock rate.

15. The method of claim 8, wherein generating the plurality of input data streams comprises determining a quantity of filters operating at the second clock rate to filter each of the plurality of input data streams.

16. The method of claim 8 wherein the individual streams of output serial data operate at the first clock rate.

17. A programmable logic device, comprising:
a deserializing circuit capable of converting serial data operating at a first clock rate to parallel data;
an input data reformatter circuit capable of converting the parallel data into a plurality of input data streams;
a Finite Impulse Response filter circuit capable of filtering each input data stream at a second operating clock rate, the Finite Impulse Response comprising a number of digital filters; and
an output data reformatter circuit capable of converting the plurality of filtered input data streams into streams of output serial data operating at the first clock rate,
wherein the number of the digital filters is equal to the first clock rate divided by the second clock rate.

18. The programmable logic device of claim 17, wherein the deserializing circuit comprises a plurality of deserializer circuits, wherein each deserializer circuit is capable of generating a digital word in response to receiving an individual stream of the serial data.

19. The programmable logic device of claim 18, wherein the input data reformatter circuit comprises a plurality of registers, wherein each register is coupled to one respective output of each deserializer circuit, wherein each one output has the same weighted bit position.

20. The programmable logic device of claim 17, wherein the Finite Impulse Response filter circuit comprises at least one filter for each input data stream.

21. The programmable logic device of claim 20, wherein the at least one filter comprises a finite impulse response filter.

22. The programmable logic device of claim 17, wherein the output data reformatter circuit comprises at least one serializer circuit capable of generating a digital word at the first clock rate from the filtered input data stream.

23. The programmable logic device of claim 17, wherein the output data reformatter circuit comprises at least another serializer circuit capable of converting the digital word into individual streams of output serial data.

24. An integrated circuit comprising:
a plurality of deserializing circuits, each of said plurality of deserializing circuits coupled to serially receive a bit in each of a first number of words and configured to output the bits in parallel, each of said first number of words comprising a second number of bits;
a Finite Impulse Response filter circuit coupled to receive the outputs from the plurality of deserializing circuits and configured to output a first number of filtered words, each of said first number of filtered words comprising the second number of bits; and
a plurality of serializing circuits, each of said plurality of serializing circuits coupled to receive a bit in each of the first number of filtered words in parallel and configured to serially output the bits,
wherein inputs of the deserializing circuits and outputs of the serializing circuits operate at a first clock rate and the Finite Impulse Response filter circuit operates at a second clock rate, and
wherein the Finite Impulse Response filter circuit comprises a third number of finite impulse response filters, wherein the third number is equal to the first clock rate divided by the second clock rate wherein inputs of the deserializing circuits and outputs of the serializing circuits operate at a first clock rate and the Finite impulse Response filter circuit operates at a second clock rate, and
Wherein the Finite Impulse Response filter circuit comprises a third number of finite impulse response filters, wherein the third number is equal to the first clock rate divided by the second clock rate.

25. The integrated circuit of claim 24 further comprising:
an input reformatter circuit coupled to receive the outputs from the deserializing circuits and configured to provide an output to the Finite Impulse Response filter circuit, wherein the input reformatter circuit receives a bit at a bit location from each from each of the first number of words from each deserializing circuit, and provides the first number of words in parallel to the Finite Impulse Response filter circuit.

26. The integrated circuit of claim 25 further comprising:
an output reformatter circuit coupled to receive the outputs from the Finite Impulse Response filter circuit and configured to provide outputs to the serializing circuits, wherein the output reformatter circuit receives the first number of filtered words in parallel and provides a bit at a bit location from each of the first number of filtered words to each deserializing circuit.

27. The integrated circuit of claim 24 wherein the Finite Impulse Response filter circuit comprises a plurality of registers, the number of registers determined by multiplying the second number by the sum of the third number less one plus a number of taps for the finite impulse response filters.

28. The integrated circuit of claim 24 wherein the Finite Impulse Response filter circuit comprises a first number of finite impulse response filters, wherein the value of the first number of finite impulse response filters is the same as the value of the first number of words.

29. The integrated circuit of claim 24 further comprising:
an analog-to-digital converter to provide the first number of words to the deserializing circuits.

30. A method of filtering data comprising:
serially receiving a first number of words, each word comprising a second number of bits;
deserializing the received first number of words and providing the first number of words in parallel;
filtering the first number of parallel words using a Finite Impulse Response filter circuit to provide a first number of filtered words in parallel; and
serializing the first number of filtered words, each filtered word comprising the second number of bits,
wherein the deserializing and serializing occur at a first clock rate and the filtering occurs at a second clock rate, and
wherein the filtering is performed using a third number of finite impulse response filters, wherein the third number is equal to the first clock rate divided by the second clock rate wherein the deserializing and serializing occur at a first clock rate and the filtering occurs at a second clock rate, and
Wherein the filtering is performed using a third number of finite impulse response filters, wherein the third number is equal to the first clock rate divided by the second clock rate.

31. The method of claim 30 wherein the filtering comprises registering the first number of words, the number of registers determined by multiplying the second number by the sum of the third number less one plus a number of taps for the finite impulse response filters.

32. The method of claim 30 wherein the filtering is performed using a first number of finite impulse response filters, wherein the value of the first number of finite impulse response filters is the same as the value of the first number of words.

33. The method of claim 30 wherein the first number of words are provided by an analog-to-digital converter.

* * * * *